(12) United States Patent     (10) Patent No.:   US 12,650,442 B2

Kalacska       (45) Date of Patent:    Jun. 9, 2026

(54) MICROMECHANICAL SENSOR HAVING INCREASED SENSITIVITY AND A MEMS COMPONENT HAVING SUCH A SENSOR

(71) Applicant: Robert Bosch GmbH, Stuttgart (DE)

(72) Inventor: Daniel Gyorgy Kalacska, Budapest (HU)

(73) Assignee: ROBERT BOSCH GMBH, Stuttgart (DE)

( * ) Notice: Subject to any disclaimer, the term of this patent is extended or adjusted under 35 U.S.C. 154(b) by 327 days.

(21) Appl. No.: 18/481,559

(22) Filed: Oct. 5, 2023

(65) Prior Publication Data

US 2024/0133913 A1    Apr. 25, 2024
US 2024/0230705 A9    Jul. 11, 2024

(30) Foreign Application Priority Data

Oct. 21, 2022    (DE) ..................... 10 2022 211 196.6

(51) Int. Cl.
   *G01P 15/08*      (2006.01)
   *B81B 7/00*      (2006.01)
   *B81B 7/02*      (2006.01)
   *G01P 15/125*      (2006.01)

(52) U.S. Cl.
   CPC ........ *G01P 15/0802* (2013.01); *B81B 7/0016* (2013.01); *B81B 7/0045* (2013.01); *B81B 7/007* (2013.01); *B81B 7/02* (2013.01); *G01P 15/125* (2013.01)

(58) Field of Classification Search
   CPC .. G01P 15/125; G01P 15/0802; B81B 7/0016; B81B 7/02; B81B 7/007; B81B 7/0045
   See application file for complete search history.

(56) References Cited

U.S. PATENT DOCUMENTS

| | | | | |
|---|---|---|---|---|
| 2013/0299923 | A1* | 11/2013 | Classen | ................. B81B 3/0051 |
| | | | | 257/415 |
| 2015/0143907 | A1* | 5/2015 | Ullrich | .................. B81B 3/0051 |
| | | | | 73/514.32 |
| 2017/0023606 | A1 | 1/2017 | Naumann | |
| 2018/0045515 | A1* | 2/2018 | Simoni | ............... G01P 15/0802 |
| 2019/0135612 | A1* | 5/2019 | Boessendoerfer | .... B81B 3/0051 |
| 2022/0091154 | A1* | 3/2022 | Nagel | ..................... B81B 3/001 |
| 2024/0103035 | A1* | 3/2024 | Classen | ................. B81B 3/0051 |

FOREIGN PATENT DOCUMENTS

| | | |
|---|---|---|
| DE | 3824695 A1 | 2/1990 |
| DE | 102009000407 A1 | 7/2010 |

* cited by examiner

*Primary Examiner* — Helen C Kwok

(74) *Attorney, Agent, or Firm* — NORTON ROSE FULBRIGHT US LLP

(57) ABSTRACT

A micro-electromechanical sensor. The micro-electromechanical sensor includes a substrate and a sensor element that can be resiliently deflected relative to the substrate is described. The sensor element is designed in the shape of a rocker having a light side and a heavy side, wherein the light side of the sensor element has a smaller layer thickness in at least one functional region than has the heavy side of the sensor element. An opening having a flexible stop structure is formed in the functional region. A reinforcing structure at least partially surrounding the opening is also provided in the functional region. The reinforcing structure is at least partially realized by an alternating sequence of anchor segments and connecting segments. The connecting segments have a smaller width than the anchor segments.

10 Claims, 9 Drawing Sheets

MICROMECHANICAL SENSOR HAVING INCREASED SENSITIVITY AND A MEMS COMPONENT HAVING SUCH A SENSOR

CROSS REFERENCE

The present application claims the benefit under 35 U.S.C. § 119 of German Patent Application No. DE 10 2022 211 196.6 filed on Oct. 21, 2022, which is expressly incorporated herein by reference in its entirety.

FIELD

The present invention relates to a micro-electromechanical sensor having increased sensitivity. The present invention further relates to a MEMS component having such a micro-electromechanical sensor.

BACKGROUND INFORMATION

Micro-electromechanical components (MEMS), which combine logic elements and micro-electromechanical structures in one chip, are used, among other things, as inertial sensors for measuring accelerations and rotation rates. Such sensors generally comprise a sensor element that can be resiliently deflected relative to the substrate, is used as a seismic mass, and can be designed in the shape of a rocker in order to measure accelerations perpendicular to the substrate plane. In order to prevent the rocker from adhering with one side to the substrate during mechanical overloading, which would impair the functionality of the sensor, integrated flexible stoppers or stop structures are used in the sensor element which facilitate a detachment of the rocker from the substrate. Although the heavy side of the MEMS rocker is more susceptible to the adhesion problem, flexible stoppers are being increasingly used on both sides in order to achieve a symmetrical adhesion and release behavior in the case of opposite accelerations.

The greatest challenge with these flexible stoppers in the main functional layer of MEMS-rocker structures is that their introduction not only has effects on static friction and clipping but also on the sensitivity and the drop robustness of the design. The introduction of a flexible stopper on the heavy side reduces the sensitivity of the rocker since it takes mass off the heavy side. The introduction of a flexible stopper on the light side also reduces sensitivity, since this gives the light side additional mass.

Since the flexible stopper in the main functional layer only functions when the secondary functional layer underneath it is removed, the secondary functional layer on the light side now has freely movable edges around the flexible stopper, which makes the secondary functional layer unstable under high dynamic loads. In order to counteract this, a support structure or reinforcing structure can be attached around the flexible stopper on the light side, which support structure completely surrounds it from all sides. Such a reinforcing structure is therefore responsible for the mechanical stability of the flexible stopper and the surrounding secondary functional layer. However, this reinforcing structure also means even more mass on the light side, which further reduces the sensitivity of the sensor. This reinforcing structure consists of the main functional layer and the connecting layer arranged between the main functional layer and the secondary functional layer, the connection of which connecting layer is as a rule defined at a specific minimum distance by layout rules. As a result, the mass of the reinforcing structure cannot be reduced further by a reduction in its layer thickness.

SUMMARY

A problem addressed by the present invention can therefore be considered that of providing a stabilization of the light side of the sensor element used as seismic mass, in particular in the region of the flexible stop structure, while simultaneously ensuring as high a sensitivity of the micro-electromechanical sensor as possible. This object may be achieved by features of the present invention. Advantageous embodiments of the present invention are disclosed herein.

According to an example embodiment of the present invention, a micro-electromechanical sensor comprising a substrate and a sensor element that can be resiliently deflected relative to the substrate is provided, wherein the sensor element is designed in the shape of a rocker having a light side and a heavy side. The light side of the sensor element has a lower layer thickness in a functional region than has the heavy side of the sensor element. Furthermore, an opening having a flexible stop structure is formed in the functional region in question, wherein a reinforcing structure for the flexible stop structure is further provided in the functional region in question, which reinforcing structure at least partially surrounds the opening. In this case, the reinforcing structure is at least partially realized by an alternating sequence of anchor segments and connecting segments, wherein the connecting segments have a smaller width than the anchor segments. The reinforcing structure makes it possible to improve the rigidity of the light side of the sensor element in the region of the flexible stop structure. In this case, recesses are deliberately created in the reinforcing structure by the reduced width of the connecting segments, which recesses effect a reduction in the dead weight of the reinforcing structure. A high mechanical stability of the reinforcing structure is thereby achieved and at the same time a relatively high sensitivity of the sensor is ensured.

In one example embodiment of the present invention, the heavy side of the sensor element is realized by a layer sequence comprising a main functional layer, a connecting layer, and a secondary functional layer. In this case, the functional region of the light side of the sensor element is realized by a layer sequence comprising the connecting layer and the secondary functional layer. This concept offers a particularly simple way of realizing the desired mass difference between the light and heavy sides of the sensor element.

In a further example embodiment of the present invention, the reinforcing structure is realized by a layer sequence consisting of the main functional layer, the connecting layer, and the secondary functional layer. A simple production of the reinforcing structure is thereby made possible.

In a further example embodiment of the present invention, the anchor segments are realized by a layer sequence consisting of the main functional layer, the connecting layer, and the secondary functional layer, while the connecting segments are realized by a layer sequence consisting of only the main functional layer and the functional layer. This design makes possible a further reduction in the mass of the reinforcing structure, which is accompanied by an improvement in the sensitivity of the sensor.

In a further example embodiment of the present invention, the anchor segments have different lengths and/or widths in at least one subregion of the reinforcing structure. The ratio between the mechanical stability and weight of the reinforcing structure in different regions of the reinforcing structure can thereby be optimized.

In a further example embodiment of the present invention, the connecting segments have different lengths and/or widths in at least one subregion of the reinforcing structure. The ratio between the mechanical stability and weight of the reinforcing structure in different regions of the reinforcing structure can thereby be optimized.

In a further example embodiment of the present invention, the reinforcing structure extends directly along the periphery of the opening in the flexible stop structure. As a result of this measure, the region of the flexible stop structure is stabilized particularly well. Furthermore, the length of the reinforcing structure and thus also its mass can thereby be reduced, which is accompanied by an increase in the sensitivity of the sensor.

In a further example embodiment of the present invention, the sensor element comprises a stiffening frame which extends along the outer edge of the light side and at least partially surrounds the functional region in a frame-like manner. The reinforcing structure and the stiffening frame are connected to one another by means of at least one connecting piece. The stiffening frame and the connecting piece improve the mechanical properties of the entire functional region. With the aid of the connecting piece, the forces occurring during contact of the sensor element with the substrate in the region of the flexible stop structure can be particularly well diverted onto the stiffening frame.

In a further example embodiment of the present invention, the reinforcing structure completely surrounds the opening. As a result of this measure, a particularly high rigidity of the light side of the sensor element is achieved in the region of the stop structure.

According to a further aspect of the present invention, a micro-electromechanical component having a corresponding micro-electromechanical sensor is also provided. The advantages described in connection with the micro-electromechanical sensor apply to the micro-electromechanical component.

The present invention is explained in more detail below with reference to the figures.

DETAILED DESCRIPTION OF EXAMPLE EMBODIMENTS

The design according to the present invention aims to minimize the effects of the reinforcing structure on sensitivity. This is achieved by a special design of the reinforcing structure in the form of a chain-like arrangement, which comprises anchored segments (anchor segments) and non-anchored segments (connecting segments). The minimum width only needs to be observed at the anchored "chain points" (anchor segments), while the connecting bars (connecting segments) can have the smallest possible width overall. The chain shape formed by the alternating sequence of anchor segments and connecting segments can in this case be realized on parts of the surrounding reinforcing structure or on the entire reinforcing structure.

Figure 1:
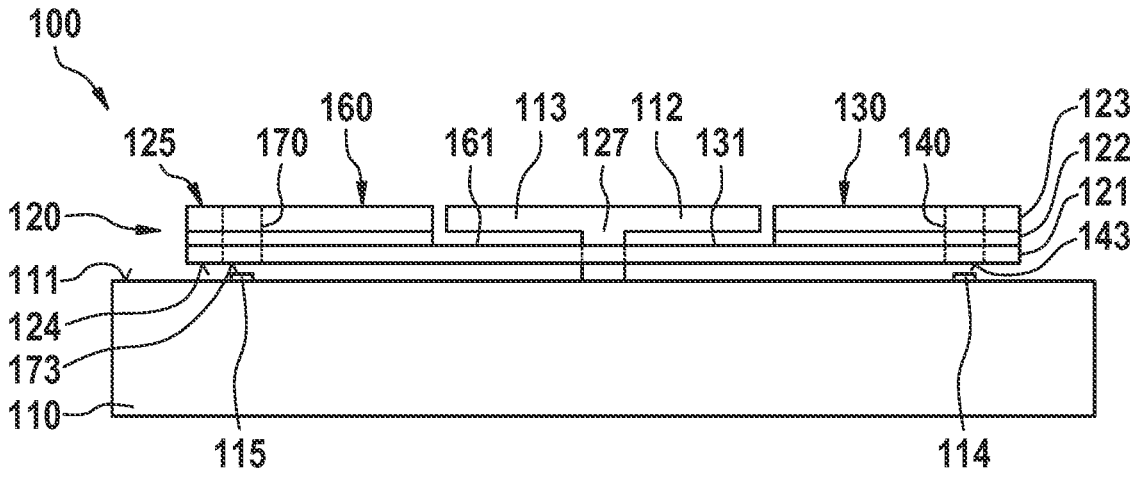
FIG. 1 shows schematically a side view of a rocker-shaped sensor having a sensor element comprising two flexible stop structures, according to an example embodiment of the present invention.

FIG. 1 schematically shows the structure of a micro-electromechanical sensor 100, which is designed in the shape of a rocker. The sensor 100 comprises a sensor element 120 that can be resiliently deflected relative to the substrate 110 and forms a seismic mass. The sensor element 120 has a heavy side 160 and a light side 130, which in the present case have the same lateral dimensions. In the present example, the sensor element 120 has a multilayer structure consisting of a secondary functional layer 121, a connecting layer 122, and a main functional layer 123. A typical sensor element 120 in addition generally comprises one or more layers which establish the electrical and mechanical connection between the functional layers and the substrate or the wiring formed on the substrate.

These layers are not shown here for reasons of clarity. The mounting of the sensor element 120 preferably realized in a central region typically uses micro-mechanically structured spring structures which are fastened to a central anchor structure 127. In the present example, torsion springs in particular are used as the spring structures. However, flexural springs or a combination of torsion and flexural springs can also be used for this purpose.

Figure 2:
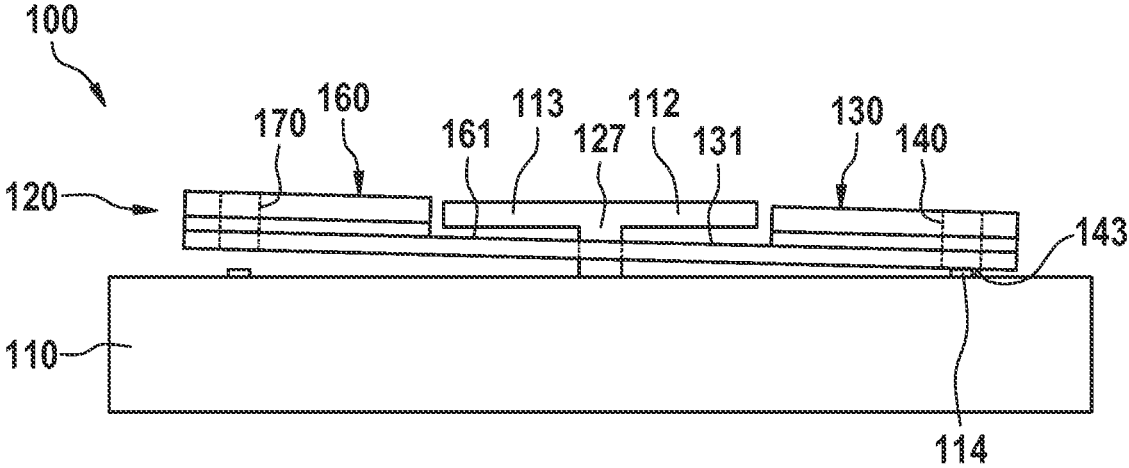
FIG. 2 shows a situation in which a flexible stop structure of the sensor element from FIG. 1 comes into contact with the substrate as a result of a mechanical overload.

As can also be seen from FIG. 1, the sensor 100 comprises suitable electrodes for detecting the movement of the sensor element 120 relative to the substrate 110. In the present example, each of the two sides 130, 160 of the sensor element 120 has an electrode 131, 161 on its bottom 124 in each case, which electrode interacts in each case with an electrode 112, 113 complementary thereto on the surface 111 of the substrate 110. The sensor element 120 further comprises flexible stop structures 140, 170 which, under mechanical overload, allow a defined contact between the sensor element 120 and the substrate 110 and facilitate the detachment of the sensor element 120 from the substrate surface 111. Depending on the application, as is shown here only by way of example, suitable stop structures 114, 115 can be provided on the substrate 110 which interact with the stop structures 140, 170 of the rocker 120. FIG. 2 shows a situation in which the light side 130 of the sensor element 120 with the stop structure 140 is touching the surface 111 of the substrate 110.

Figure 3:
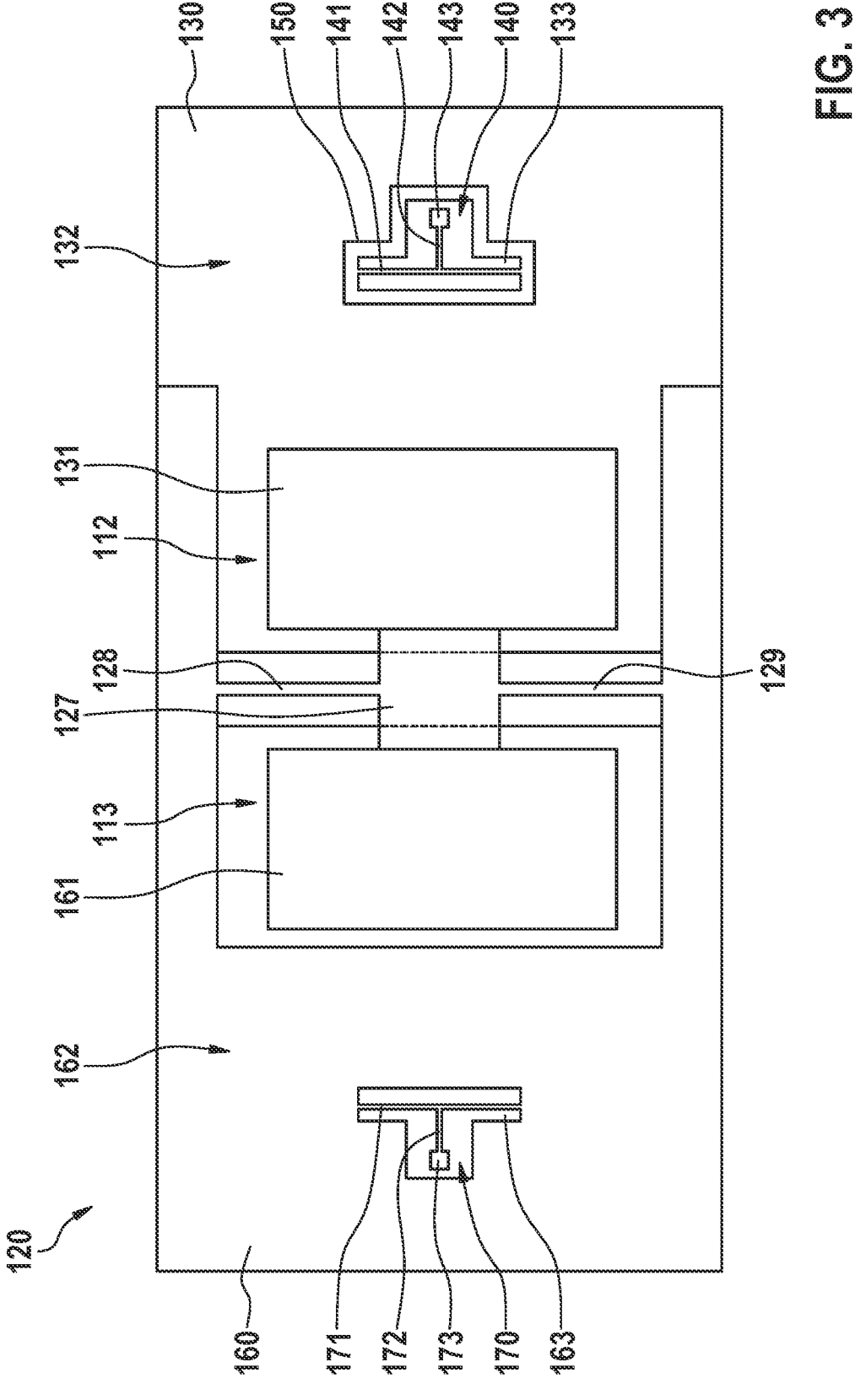
FIG. 3 schematically shows the bottom of the sensor element from FIG. 1.

FIG. 3 is a plan view of a rocker-shaped sensor element 120. It can be seen here that by means of two torsion springs 128, 129 the sensor element 120 is mounted on the anchor structure 127 connected to the substrate. In this case, the heavy side 160 of the rocker 120 in a functional region 162 is constructed not only from the secondary functional layer 121 and the connecting layer 122 but also from the main functional layer 123, while the light side 130 of the rocker 120 in the corresponding functional region 132 is substantially constructed only from the secondary functional layer 121 and the connecting layer 122. It can also be seen that an opening 133, 163 having a flexible stop structure 130, 170 arranged therein is provided not only in the functional region 132 of the light side 130 but also in the functional region 162 of the heavy side 160 of the sensor element 120. The stop structures in each case comprise a contact structure 143, 173 which is in each case fastened to its own torsion spring 141, 171 by means of a beam structure 142, 172. In this way, the two contact structures 143, 173 can be deflected perpendicular to the substrate plane. As can also be seen from FIG. 3, the light side 130 of the sensor element 120 has a special reinforcing structure 150 which extends in a frame-like manner along the opening 133. The reinforcing structure 150 effects a stiffening of the region around the opening 133, whereby the mechanical stability of the stop structure 140 is increased. As indicated in FIG. 3, the reinforcing structure 150 extends along the entire periphery of the opening 133. As an alternative thereto, the reinforcing structure 150 can also extend only along part of the periphery of the opening 133.

Figure 4:
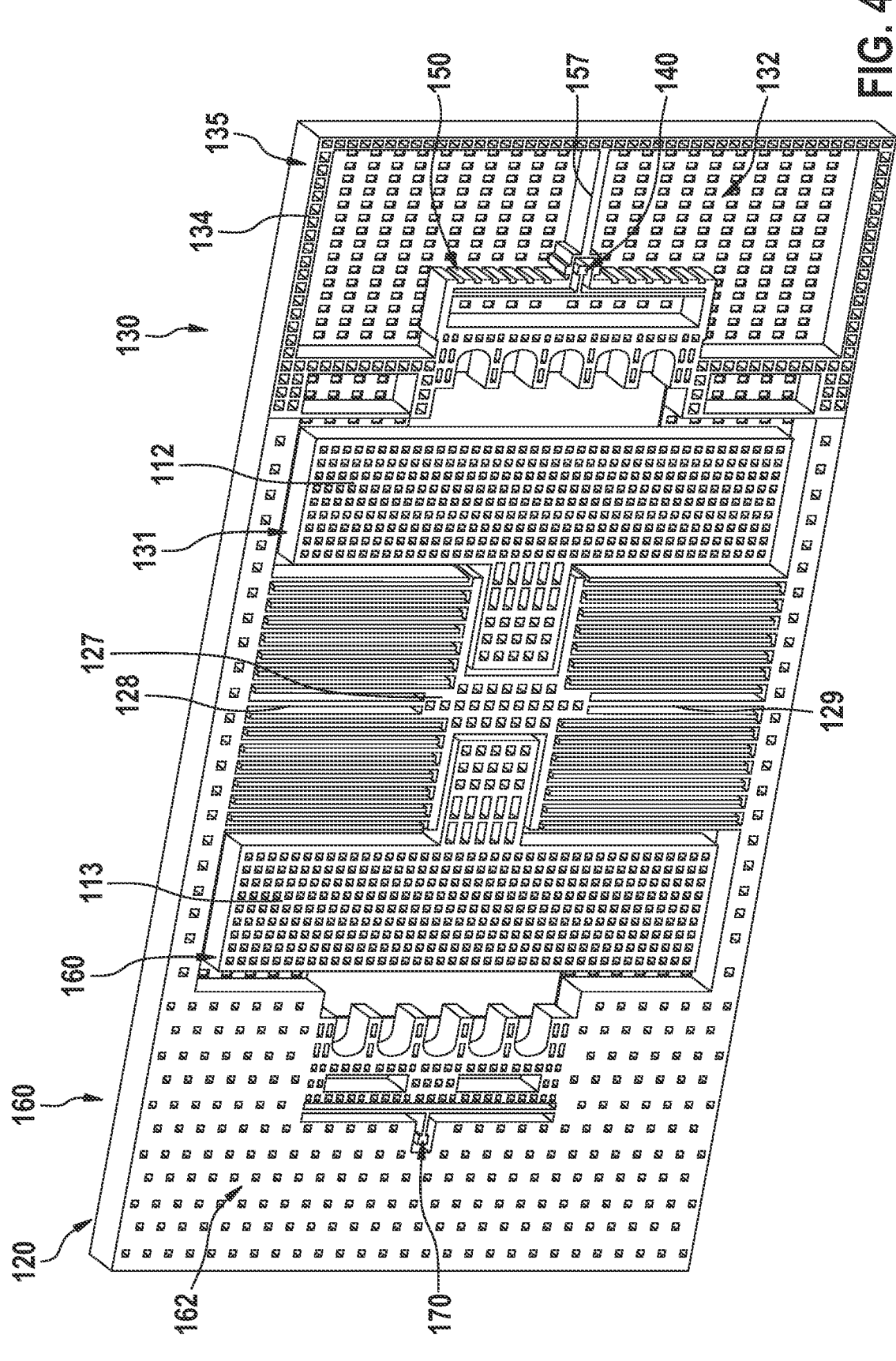
FIG. 4 is by way of example a perspective view of the bottom of a modified sensor element having a reinforcing structure in the region of the flexible stop structure, according to an example embodiment of the present invention.
Figure 5:
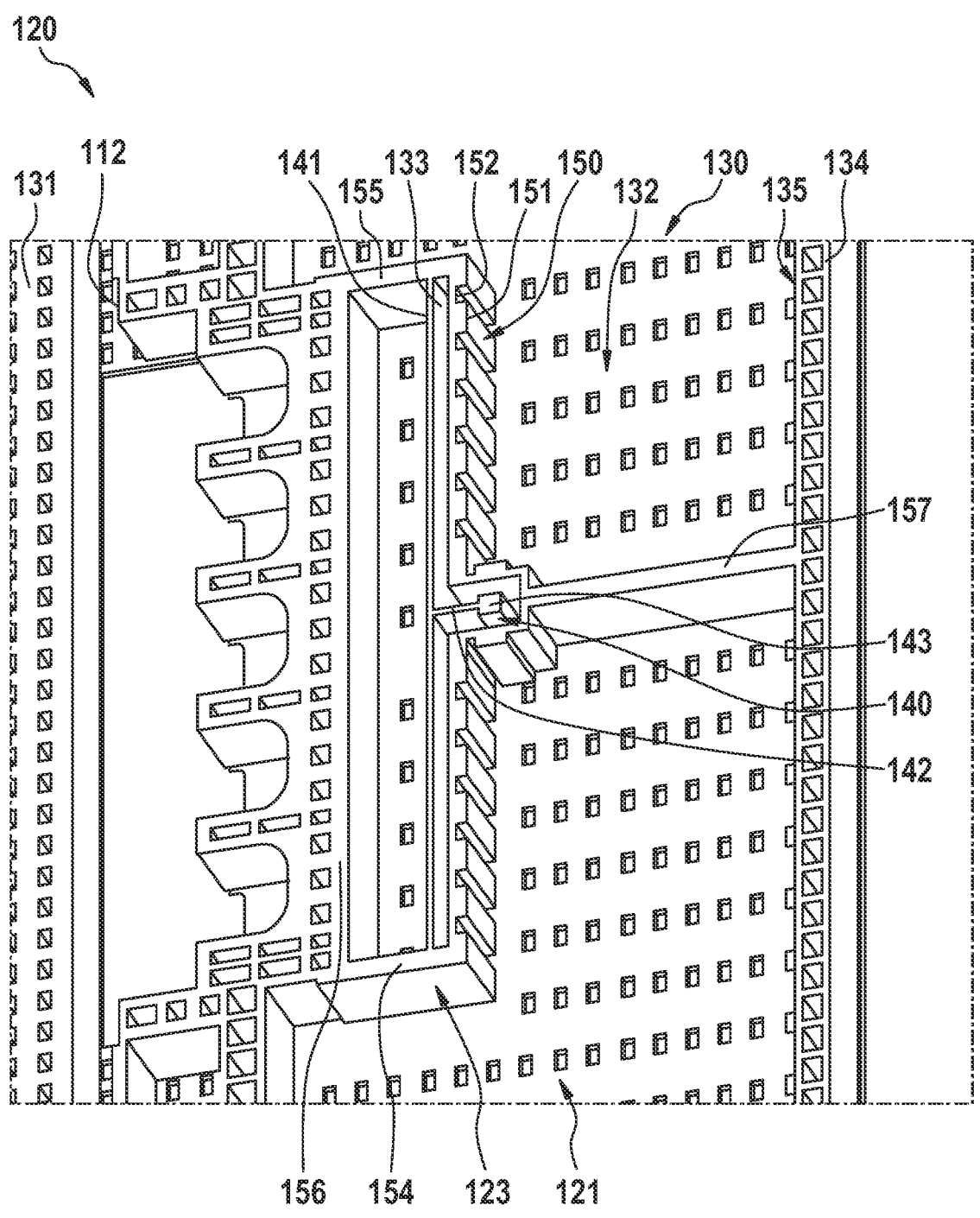
FIG. 5 is a detailed view of the reinforcing structure of the sensor element from FIG. 4.

FIG. 5 is a detailed view of the reinforcing structure 150 on the light side 130 of the sensor element 120 from FIG. 4. It can be seen here that the reinforcing structure 150 comprises an alternating or chain-like arrangement consisting of anchor segments 151 and connecting segments 152, wherein the connecting segments 152 in each case connect two of the anchor segments 151 to one another. The connecting elements 152 have a smaller width than the anchor segments 151 and are in each case arranged on the side of the reinforcing structure 150 facing the opening 133. As a result, a recess is created in the reinforcing structure 150 at the connecting elements 152, by means of which recess a reduction in the mass of the reinforcing structure 150 is achieved.

Figure 6:
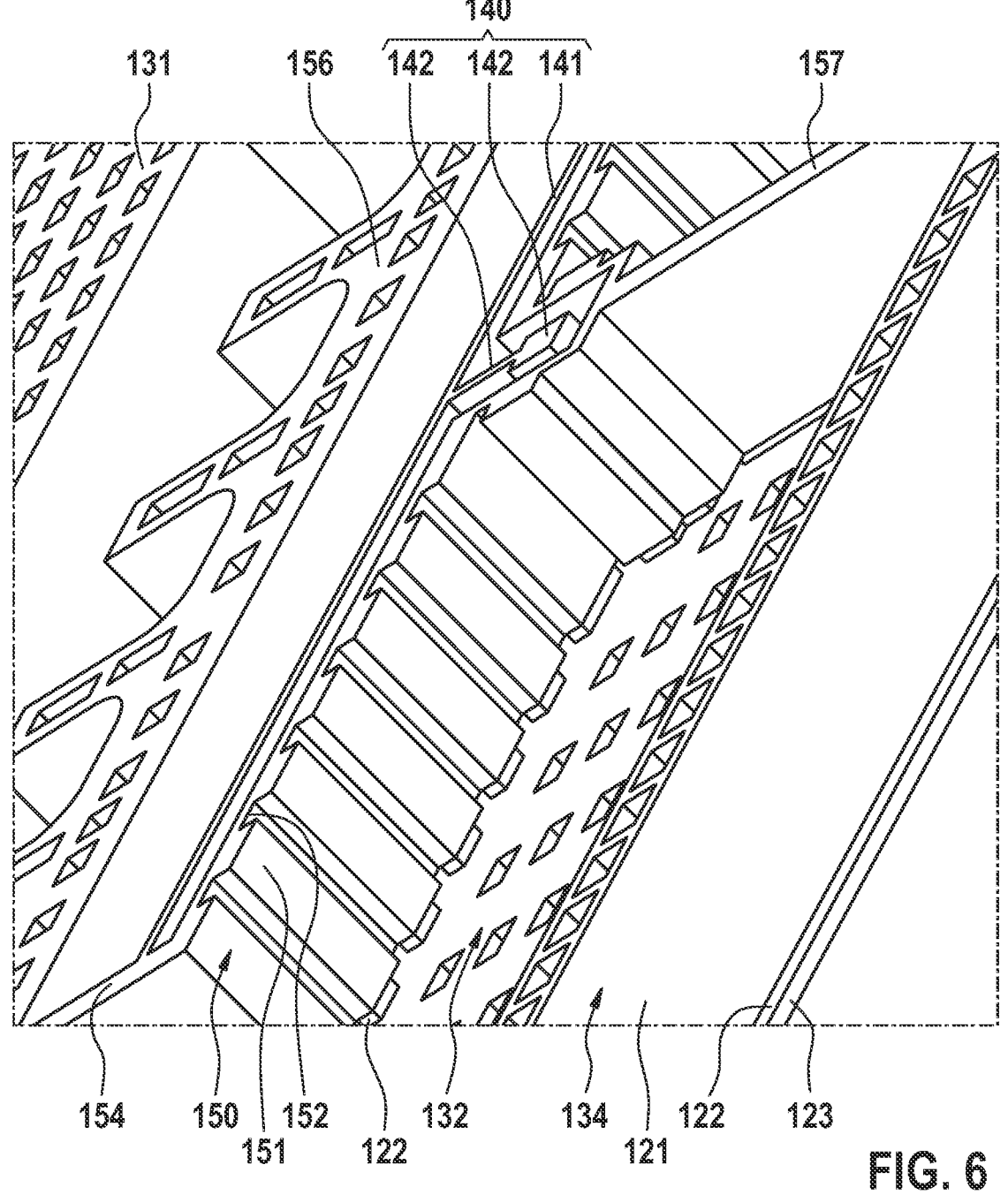
FIG. 6 is an even more detailed view of the reinforcing structure shown in FIG. 5.

FIG. 6 is a further detailed view of the reinforcing structure 150 from FIG. 4 from a different perspective, from which the layer structure of the anchor segments 151 and connecting segments 152 can be seen. It can be seen that the anchor segments 151 are formed in the main functional layer 123 and are connected to the secondary functional layer 121 via corresponding anchoring structures 158 of the connecting layer 122 arranged beneath the main functional layer 123. On the other hand, the connecting elements 152, which are also formed in the main functional layer 123, have no corresponding anchoring structures, such that the reinforcing structures 150 in these regions have no connection between the main function layer 123 and the secondary functional layer 121.

Figure 7:
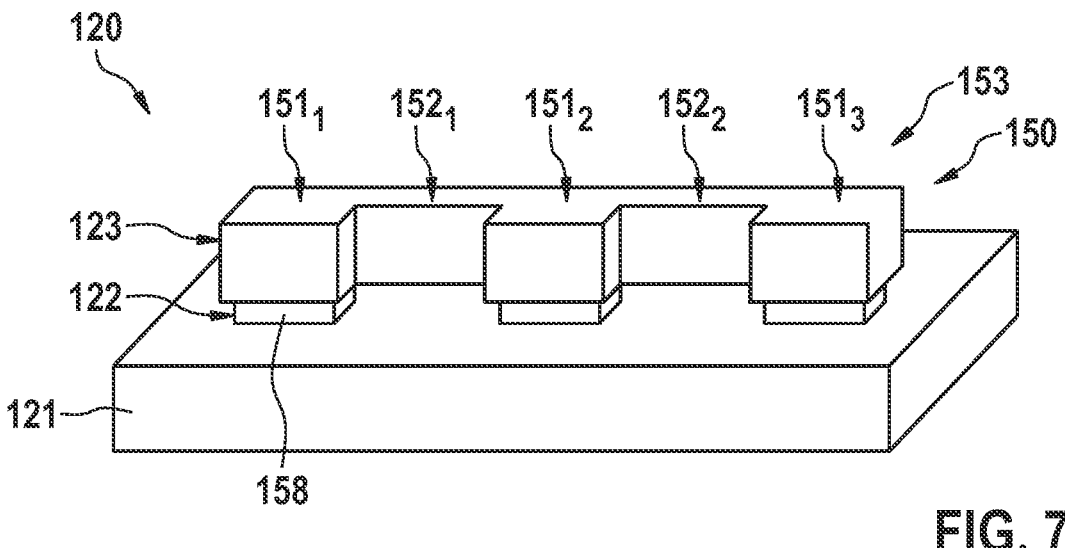
FIG. 7 schematically illustrates the layered structure of the reinforcing structure, according to an example embodiment of the present invention.

The special design of the reinforcing structure 150 is also clear from FIG. 7. As can be seen here, the anchoring structures 158 realized in the connecting layer preferably have a smaller lateral dimension than the anchor segments 151 arranged thereabove.

Figure 8:
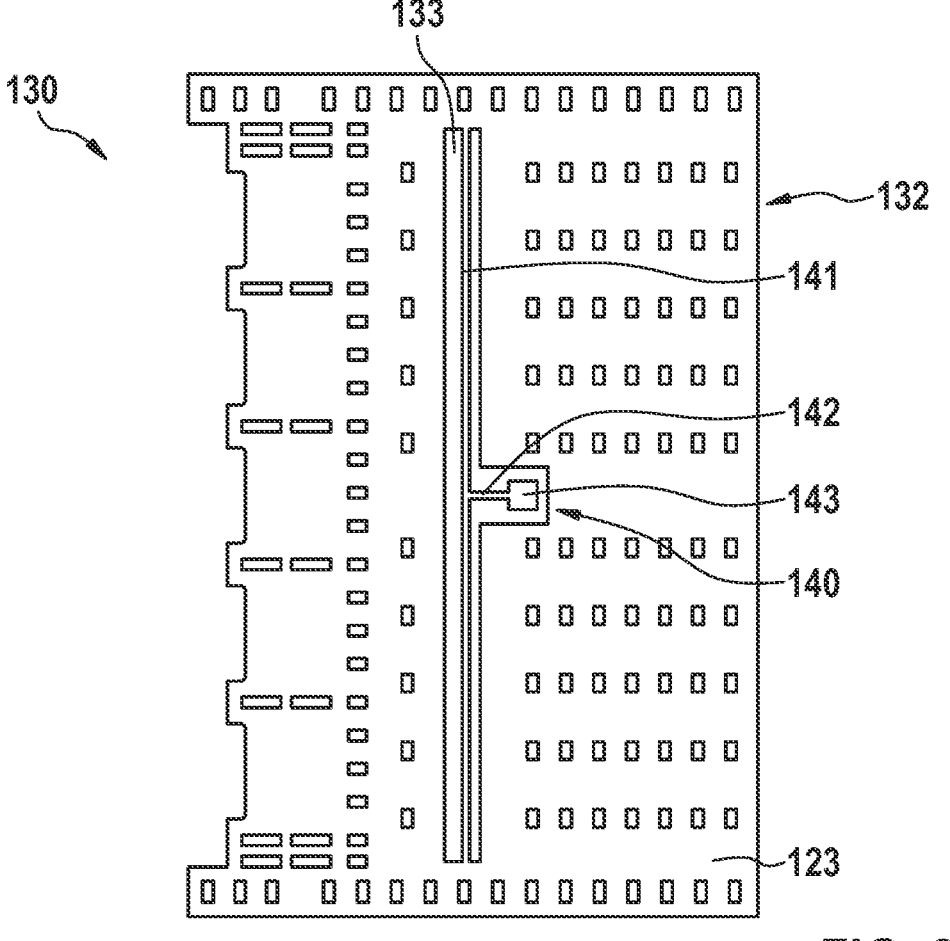
FIG. 8 shows the structuring of the secondary functional layer in the functional region of the light side of the sensor element from FIG. 4.
Figure 10:
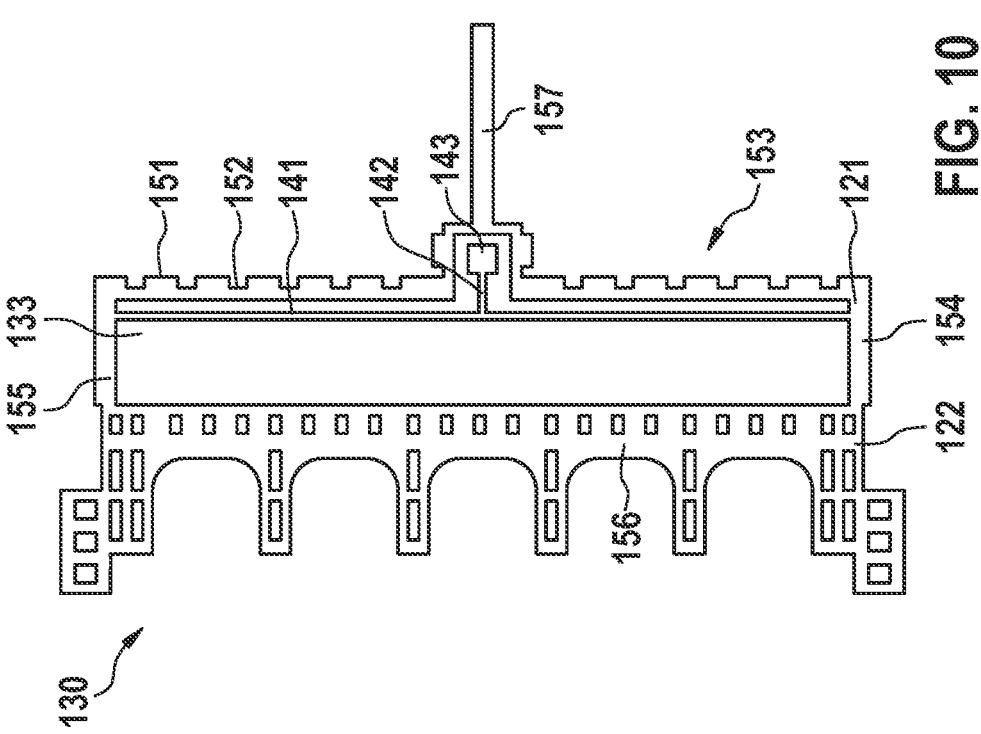
FIG. 10 shows the structuring of the main functional layer in the functional region of the light side of the sensor element from FIG. 4.
Figure 9:
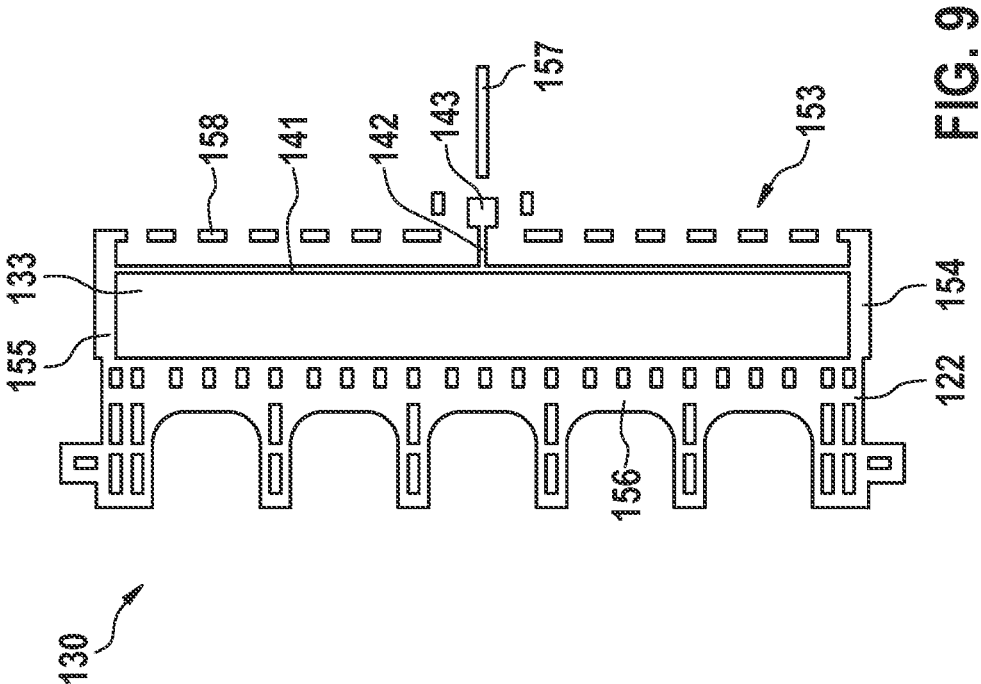
FIG. 9 shows the structuring of the connecting layer in the functional region of the light side of the sensor element from FIG. 4.

FIGS. 8 to 10 illustrate the structuring of the individual layers 121, 122, 123, from which the reinforcing structure 150 on the light side 130 of the rocker-shaped sensor element 120 is constructed. Here, FIG. 8 shows the structured secondary functional layer 121, which forms a connecting plate for the different structures on the light side 130 of the sensor element 120. It can be seen here that only the opening 133 having the torsion spring 141, the bar structure 142 and the contact structure 143 of the resilient stop structure 140 is formed in the secondary functional layer 121. The further openings visible here in the secondary functional layer 121 are merely production-related and have no function for the reinforcing structure to be produced.

FIG. 9 on the other hand shows the structuring of the connecting layer 122, which structuring is arranged on the secondary functional layer 121. It can be seen here that in the region of the chain-like outer portion 153 of the reinforcing structure 150 the connecting layer 122 is structured in the shape of a broken line, wherein the structures which have remained in each case represent an anchoring structure 158 for the anchor segments 151 arranged thereabove.

Finally, in FIG. 10 the structuring of the main functional layer 123 of the reinforcing structure 150 from FIGS. 4 to 6 is shown. As can be seen here, the main functional layer 123 forms the chain-like portion of the reinforcing structure 120 shown in FIGS. 5 and 6, comprising anchor segments 151, which have a regular width of the reinforcing structure 120, and connecting segments 152, which have a reduced width in comparison.

Figure 11:
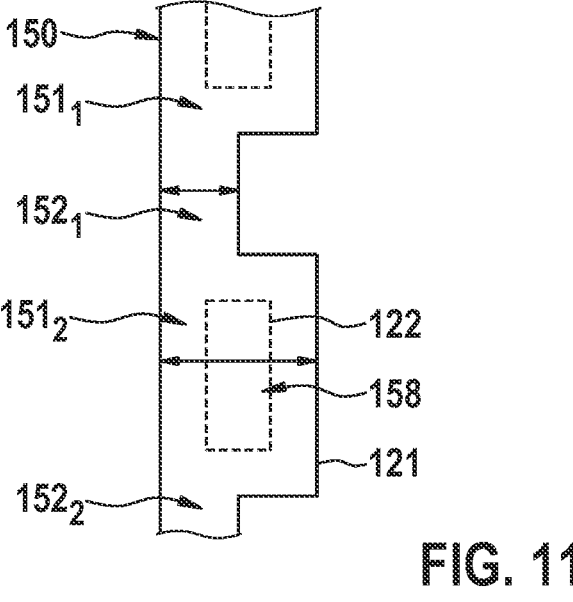
FIG. 11 schematically shows part of the reinforcing structure of the sensor element from FIG. 4.

FIG. 11 is a detailed view of the chain-like arrangement of the anchor segments 151 and of the connecting segments 152, which, depending on the application, can be realized over the entire reinforcing structure 150 or only on certain portions thereof. It can also be seen here that the anchoring structures 158 formed within the connecting layer 122 have a smaller width and length than the anchor segments 151 arranged thereabove. In the present example, the ratio of the widths of the anchor segments $151_1$, $151_2$ and the connecting segments $152_1$, $152_2$ is approximately 2:1.

The reinforcing structure 150 can in principle be characterized by the length of the anchor segments and connecting segments or by their relative ratio to one another. In the case in which the chain shape is used for the entire reinforcing structure 150 and the corresponding segments 151, 152 have a length ratio of 2:1, the mass of the reinforcing structure 150 can be reduced by approximately 13% by means of the chain shape described here. In contrast, a mass reduction of approximately 19% can be achieved with a length ratio of the corresponding segments of 1:1.

Figure 12:
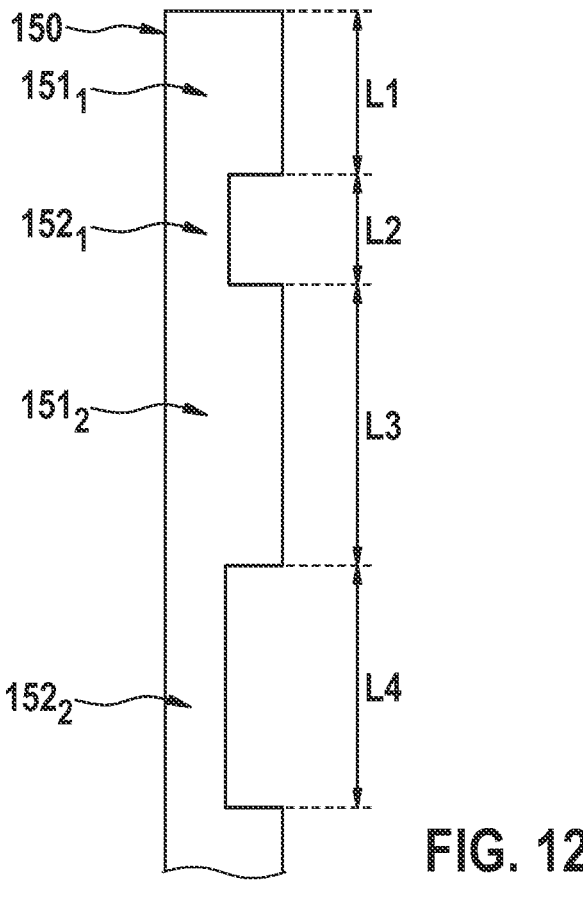
FIG. 12 shows by way of example part of a modified reinforcing structure having varying lengths of the anchor segments and connecting segments, according to the present invention.

The anchor segments 151 and connecting segments 152 shown in FIG. 11 in each case have a length ratio of 2:1. Depending on the application, however, the length ratio in question can also vary from segment to segment. Thus, FIG. 12 shows an exemplary embodiment of the chain-like arrangement in which the lengths $L_1$, $L_2$, $L_3$, $L_4$ of the anchor segments $151_1$, $151_2$ and of the connecting segments $152_1$, $152_2$ differ along the reinforcing structure 150.

In this case, it is possible for the chain pattern consisting of different lengths of the segments 151, 152 to be repeated along the reinforcing structure 150. Alternatively, it is possible that this chain pattern does not repeat or alternates in another way than is shown here. The properties of the reinforcing structure 150 (mechanical stability and weight) can thus be optimally adapted to the local requirements of the relevant application. There is also the possibility of providing anchor segments 151$_1$, 151$_2$ of different widths along the reinforcing structure 150. Likewise, the widths of the connecting segments 152$_1$, 152$_2$ can also differ along the reinforcing structure 150. The exact dimensions and arrangement of the chain structure can in this case be adapted to the requirements of the relevant application. In this way, a ratio between the stability of the region 130 in question and the sensitivity of the rocker-shaped sensor element 120 can be set which is optimal for the relevant application, this ratio being determined in particular by the ratio of the masses of the light side 130 and the heavy side 160.

Figure 13:
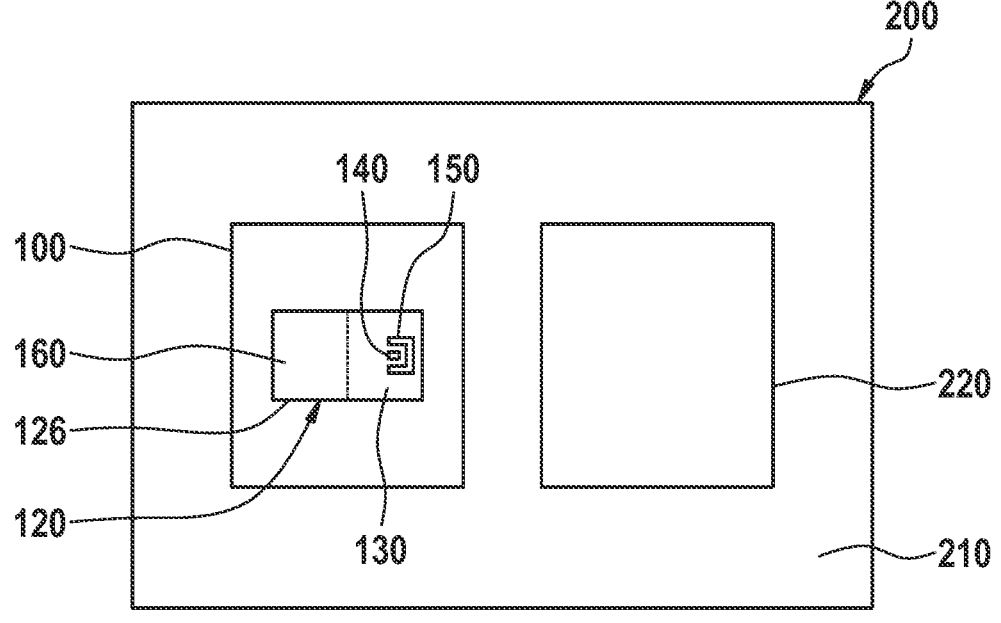
FIG. 13 shows a MEMS component having a correspondingly modified micro-electromechanical sensor, according to an example embodiment of the present invention.

Finally, FIG. 13 schematically shows a MEMS component 200 having a micro-electromechanical sensor 100 described in connection with the preceding figures. The MEMS component 200 comprises a substrate 210 on which the micro-electromechanical sensor 100 and a further chip 200 having electrical circuits (ASICs) are arranged. The MEMS sensor 100 and the ASIC 220 can in this case be arranged not only side by side but also one above the other.

What is claimed is:

1. A micro-electromechanical sensor, comprising:
a substrate; and
a sensor element that can be resiliently deflected relative to the substrate, wherein the sensor element is shaped as a rocker having a light side and a heavy side, wherein a functional region of the light side of the sensor element has a smaller layer thickness than a functional region of the heavy side of the sensor element, wherein an opening having a flexible stop structure is formed in the functional region of the light side, and a reinforcing structure at least partially delimits the opening, wherein at least part of the reinforcing structure includes an alternating sequence of anchor segments and connecting segments, the connecting segments having a smaller width than the anchor segments.

2. The micro-electromechanical sensor according to claim 1, wherein the heavy side of the sensor element includes a layer sequence including a main functional layer, a secondary functional layer, and a connecting layer arranged between the main functional layer and the secondary functional layer, and wherein the functional region on the light side of the sensor element includes a layer sequence including the connecting layer and the secondary functional layer.

3. The micro-electromechanical sensor according to claim 2, wherein the reinforcing structure includes a layer sequence including the main functional layer, the connecting layer, and the secondary functional layer.

4. The micro-electromechanical sensor according to claim 2, wherein the anchor segments include a layer sequence including the main functional layer, the connecting layer, and the secondary functional layer, and the connecting segments include a layyer sequence including only the main functional layer and the secondary functional layer.

5. The micro-electromechanical sensor according to claim 1, wherein the anchor segments have different lengths and/or widths in at least one subregion of the reinforcing structure.

6. The micro-electromechanical sensor according to claim 1, wherein the connecting segments have different lengths and/or widths in at least one subregion of the reinforcing structure.

7. The micro-electromechanical sensor according to claim 1, wherein the reinforcing structure extends directly along a periphery of the opening of the flexible stop structure.

8. The micro-electromechanical sensor according to claim 1, wherein the sensor element includes a stiffening frame which extends along an outer edge of the light side and at least partially surrounds the functional region in a frame-like manner, and wherein the reinforcing structure and the stiffening frame are connected to one another by at least one connecting piece.

9. The micro-electromechanical sensor according to claim 1, wherein the reinforcing structure completely surrounds the opening.

10. A micro-electromechanical component, comprising:
a micro-electromechanical sensor including:
a substrate, and
a sensor element that can be resiliently deflected relative to the substrate, wherein the sensor element is shaped as a rocker having a light side and a heavy side, wherein a functional region of the light side of the sensor element has a smaller layer thickness than a functional region of the heavy side of the sensor element, wherein an opening having a flexible stop structure is formed in the functional region of the light side, and a reinforcing structure at least partially delimits the opening, wherein at least part of the reinforcing structure includes an alternating sequence of anchor segments and connecting segments, the connecting segments having a smaller width than the anchor segments.

* * * * *